(12) United States Patent
Mooney

(10) Patent No.: US 6,362,657 B1
(45) Date of Patent: Mar. 26, 2002

(54) SMALL APERTURE LATCH FOR USE WITH A DIFFERENTIAL CLOCK

(75) Inventor: Stephen R. Mooney, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/584,673

(22) Filed: May 31, 2000

(51) Int. Cl.[7] .............................................. H03K 19/096
(52) U.S. Cl. ............................. 326/98; 326/112; 326/28
(58) Field of Search ....................... 326/56–58, 93–98, 326/112, 113, 21, 26–28

(56) References Cited

U.S. PATENT DOCUMENTS

| 5,493,530 A | * | 2/1996 | Lee et al. ............... 365/189.05 |
| 5,900,744 A | * | 5/1999 | Bisen et al. ................... 326/58 |
| 6,057,709 A | * | 5/2000 | Hesley ......................... 326/54 |

* cited by examiner

*Primary Examiner*—Michael Tokar
*Assistant Examiner*—Don Phu Le
(74) *Attorney, Agent, or Firm*—Schwegman, Lundberg, Woessner & Kluth, P.A.

(57) ABSTRACT

A latch having a pass gate, multiple clock paths connected to the pass gate, and a data path connected to the pass gate, wherein the data path and the multiple clock paths have the same number and types of elements.

25 Claims, 8 Drawing Sheets

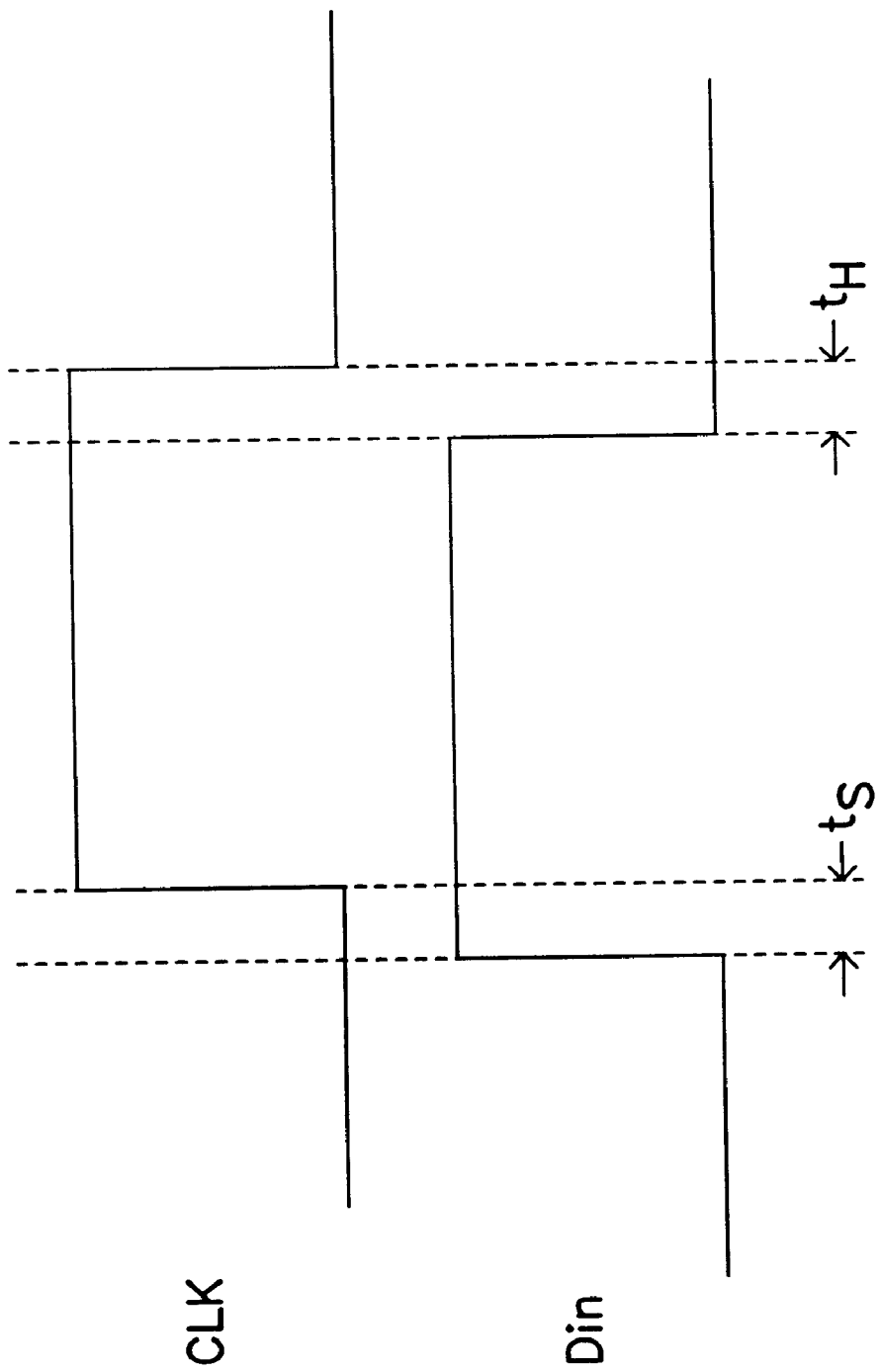

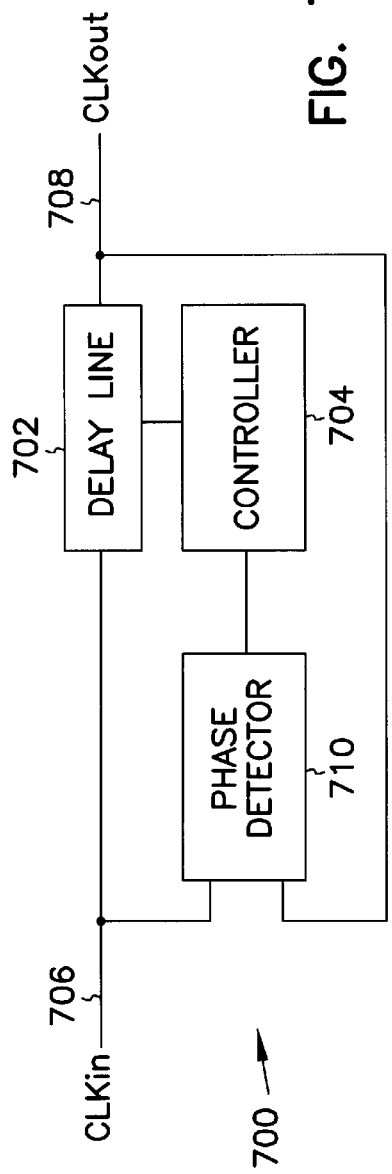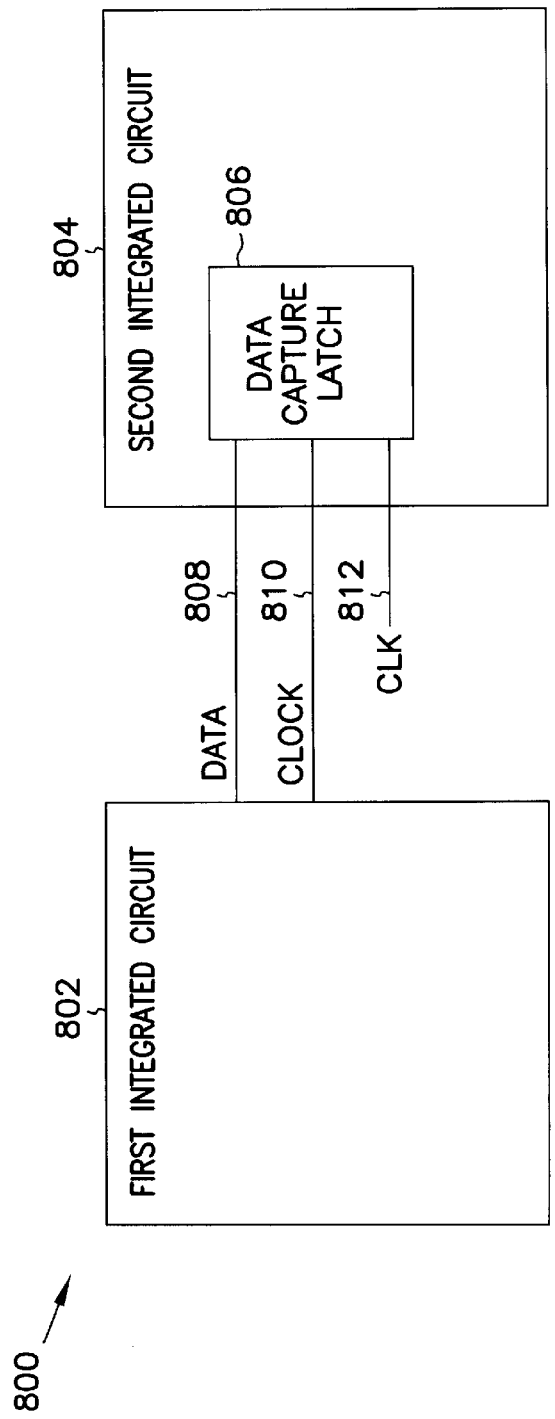

US 6,362,657 B1

SMALL APERTURE LATCH FOR USE WITH A DIFFERENTIAL CLOCK

TECHNICAL FIELD OF THE INVENTION

The present invention relates generally to integrated circuits, and in particular to latches.

BACKGROUND OF THE INVENTION

An integrated circuit includes a number of circuits connected together. Each of the circuits performs a particular task which, together with the tasks from other circuits, form a whole function of the integrated circuit. Some tasks involve processing a signal such as a data signal. Processing the data signal often requires a latching function for receiving the data signal and holding it for a certain period of time before passing it to another circuit within the integrated circuit. To ensure that the data signal is correctly received or latched, a companion signal such as a clock signal is normally sent along with the data signal to trigger or activate the latch. A typical latch has a data-to-clock setup and hold time. Setup time is the amount of time that a data signal must be present before a clock signal arrives. Hold time is the amount of time that the data signal is held valid after the clock signal has arrived. Setup and hold time occupy a portion of available time to latch the data. Therefore, the smaller the setup and hold time the better for the latch.

Setup and hold time is a function of the difference between the data and the clock paths to the latch element. In a typical latch, the clock and data paths do not have matching elements, which results in a large amount of setup and hold time. This reduces the available time to latch the data signal.

For the reasons stated above, and for other reasons stated below which will become apparent to those skilled in the art upon reading and understanding the present specification, there is a need in the art for an improved latch.

BRIEF DESCRIPTION OF THE DRAWINGS

FIG. 1B is a prior art timing diagram showing a setup and hold time of the prior art pass gate latch of FIG. 1.

FIG. 7 is a block diagram of an integrated circuit incorporating the invention.

FIG. 8 is block diagram of a system incorporating the invention.

DETAILED DESCRIPTION OF THE INVENTION

The following detailed description of the embodiments refers to the accompanying drawings which form a part hereof, and shows by way of illustration specific preferred embodiments in which the invention may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense, and the scope of the invention is defined only by the appended claims.

Figure 1A:
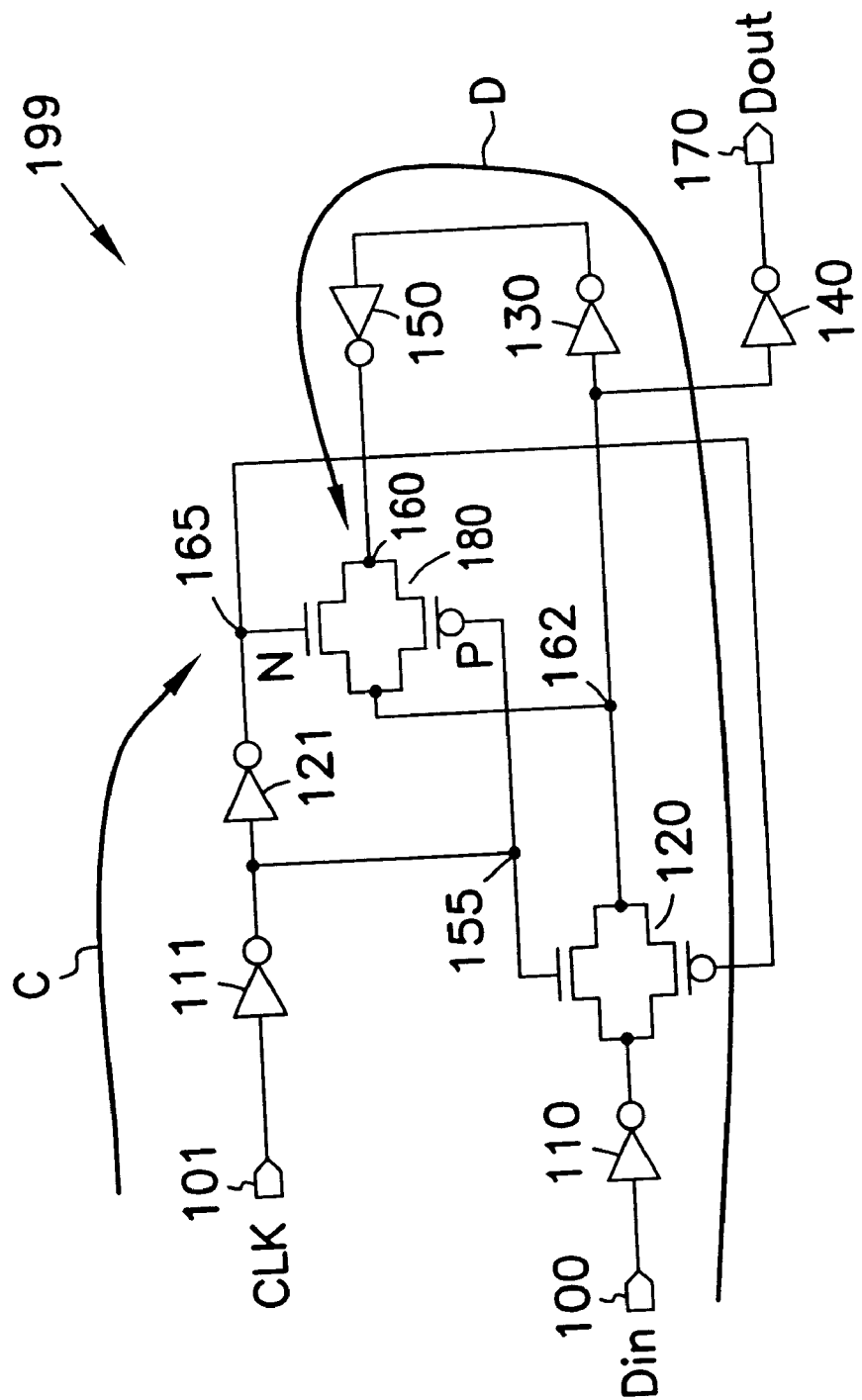
FIG. 1A is a prior art pass gate latch.

FIG. 1A is a prior art pass gate latch. Latch 199 comprises a data path D, and a clock path C. Data path D includes an input 100, an inverter 110, a pass gate 120, and inverters 130, 140 and 150. Clock path C includes an input 101, and inverters 111 and 121. Clock path C receives an input clock signal CLK at input 101 to provide control signals to pass gate 120 and to pass gate 180 at node 155 and node 165, respectively. Data path D receives an input data signal Din at input 100. At one signal level of the clock signal, input data signal Din is passed to the output at node 170 as output signal Dout. The input data is also passed to a first latch node 160. Subsequently, at the next clock transition, the data at latch node 160 prior to the clock transition will be held at latch node 160 and at output node 170 after the clock transition and Signal Dout at node 170 at this point no longer follows signal Din at node 100. Furthermore, pass gates 120 and 180 have complementary control inputs, indicated as N and P. In addition, pass gate 180 includes a second latch node 162.

In operation, clock signal CLK propagates from input 101 through two inverters 111 and 121 to node 155 and 165 to activate the pass gates. When CLK is at a LOW signal level, pass gate 180 is turned Off and pass gate 120 is turned On. When pass gate 120 is On, data signal Din at input 100 propagates through three inverters, 110, 130 and 150, and through pass gate 120 to first latch node 160. The data is also propagates to output 170. When CLK transitions to a HIGH signal level, pass gate 120 turns Off and pass gate 180 turns On. When pass gate 180 is On, the data signal prior to the transition of the CLK signal is held at first latch node 160. The data also propagates through pass gate 180 to latch node 162 and to output 170 through to inverter 140. The data at the output remains in the present state until the next transition of the clock signal.

Referring to FIG. 1A, clock signal CLK propagates though either one or two inverters (111 and 121), differing in the paths to arrive at the control inputs N and P of pass gate 180. Data signal Din propagates through three inverters (110, 130 and 150) and a pass gate (120) to arrive at latch node 160 of pass gate 180. Thus, the clock signal and the data signal propagate in paths which do not have matching elements. In other words, there is a mismatch in time delay between the clock path and the data path. The mismatch results in a big setup and hold time windows as shown in FIG. 1B. In FIG. 1B, the set up time is indicated by ts and the hold time is indicated to. While this mismatch can be minimized by better matching the data and the clock paths to reduce the setup and hold time, at least one inverter delay of mismatch will remain due to the necessity of inverting the input clock signal to drive or to provide control signals to the N and P control inputs of the pass gates.

Figure 2:
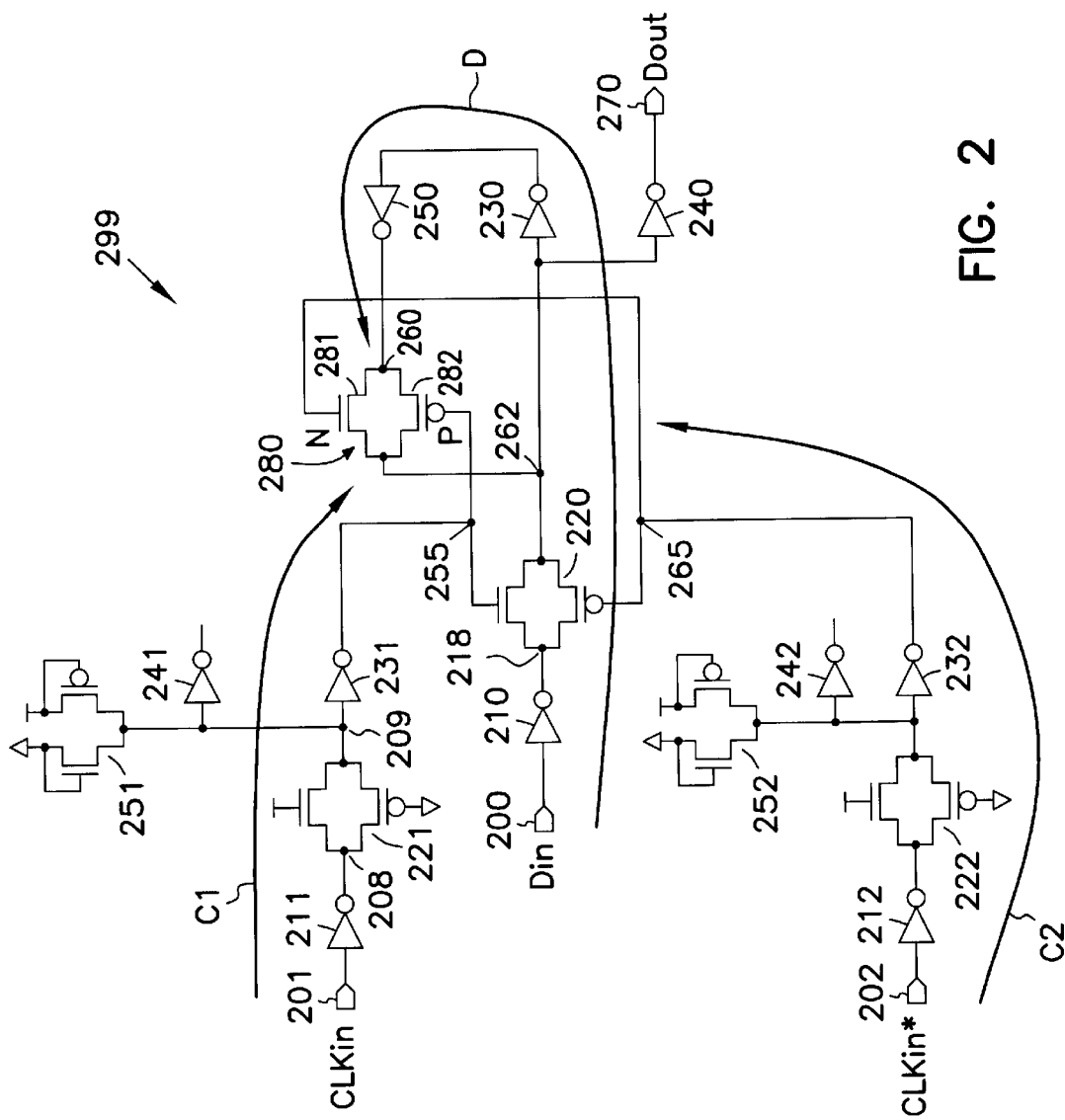
FIG. 2 is a pass gate latch according to the invention.

FIG. 2 is a pass gate latch 299 according to the invention. Latch 299 comprises data path D, a first clock path C1 and a second clock path C2. First and second clock paths C1 and C2 provide differential clock signals, or multiple clock signals, to first and second switches or pass gates 280 and 220. First pass gate 280 has complementary devices including an n-channel device 281 and a p-channel device 282. N-channel device 281 has a control input indicated by N. P-channel device 282 has a control input indicated by P. Control input P is connected to a first enable node 255 to receive a first clock signal from first clock path C1. Control input N is connected to a second enable node 265 to receive a second clock signal from second clock path C2.

First clock path C1 comprises a number of elements including an input 201, an inverter 211, a pass gate 221, inverters 231, 241 and a pass gate 251. At the beginning of clock path C1, input 201 is connected to an input of inverter 211 whose output is connected to a first gate node 208 of pass gate 221. A second node 209 of pass gate 221 is connected to an input of inverter 231. An output of inverter 231 is connected to first enable node 255. Inverter 241 and pass gate 251 are connected to the second gate node of pass gate 221 as dummy elements or dummy loads. Dummy load 251 and 241 are connected such that they are always Off. The dummy loads are designed to match with elements of clock path C2 and data path D to ensure that all paths have the same loading condition. Matching the elements including dummy loads between data path D and clock paths C1 and C2 also ensure that they have and same time delay or propagation delay. For instance, dummy loads 251 and 241 of clock path C1 can match with pass gate 252 and inverter 242 of clock path C2. Dummy loads 251 and 241 of clock path C1 can also match with pass gate 280 and inverter 240 of data path D.

Second clock path C2 comprises a number of elements including an input 202, an inverter 212, a pass gate 222, inverters 232, 242 and a pass gate 252. At the beginning of clock path C2, input 202 is connected to an input of inverter 212 whose output is connected to a first gate node of pass gate 222. A second node of pass gate 221 is connected to an input of inverter 232. An output of inverter 232 is connected to second enable node 265. Inverter 242 and pass gate 252 are connected to the second gate node of pass gate 222 as dummy elements or dummy loads. Dummy load 252 and 242 are connected such that they are always Off. As in the case of clock path C1, the dummy loads are inserted to match with elements of clock path C1 and data path D to ensure that all paths have the same loading condition. Matching the elements including dummy loads between data path D and clock paths C1 and C2 also ensure that they have and same time delay or propagation delay.

Data path D comprises a number of elements including an input 200, an inverter 210, pass gate 220, and inverters 230, 240 and 250. Input 200 is connected to an input of inverter 210 whose output is connected to a first gate node of pass gate 220. A second node of pass gate 220 is connected to an input of inverter 230. An output of inverter 230 is connected to an input of inverter 250. An output of inverter 250 is connected to a first latch node 260 of pass gate 280. Inverter 240 has its input connected to a second latch 262 of pass gate 280. The output of inverter 240 is connected to an output node 270 to provide a data output signal (Dout). Furthermore data path D is connected to pass gate 280 in two instances. A first instance is at a node 262 and a second instance is at a feedback loop including inverters 230 and 250 and pass gate 280.

Latch 299 of FIG. 2 has a first clock path C1 and a second clock path C2 with matching elements. The elements of data path D and the elements of first or second clock path C1 or C2 are also matched. In other words, all three paths, D, C1 and C2 have the same number and types of elements. For instance, node 262 of data path D is connected two pass gates (220 and 280) and two inverters (230 and 240). To match with the data path, node 209 of clock path C1 is also connected to two pass gates (221 and 251) and two inverters (231 and 241). Moreover, the data signal from node 262 propagating through inverters 230 and 250 to node 260 is equivalent to the clock signal propagating through inverter 231 and pass gate 280 to node 260. Therefore inverter 250 of data path D can match with pass gate 280 connecting to clock path C1. In summary, inverter 210, pass gate 220, and inverters 230 and 240 of data path D match with inverter 211, pass gate 221, and inverters 231, 241 of clock path C1. Similarly, the elements of data path D match with the elements of clock path C2. In addition, inverter 250 of data path D can match with pass gate 280, which is connected to both clock paths C1 and C2. Those of ordinary skill in the art will readily recognize that a mismatch between a pass gate (pass gate 280) and an inverter (inverter 250) is not substantial. Furthermore, matching the elements of all the paths, D, C1 and C2 ensures that the signals, Din, CLKin and CLKin* are propagating through the same number and types of elements to latch node 260 of latch 299. Because the elements are in the same chip and are constructed under the same fabrication parameters, they would have the same element property and delay time. Thus the matching of the elements reduces the setup and hold time of latch 299 to nearly zero.

Figure 3:
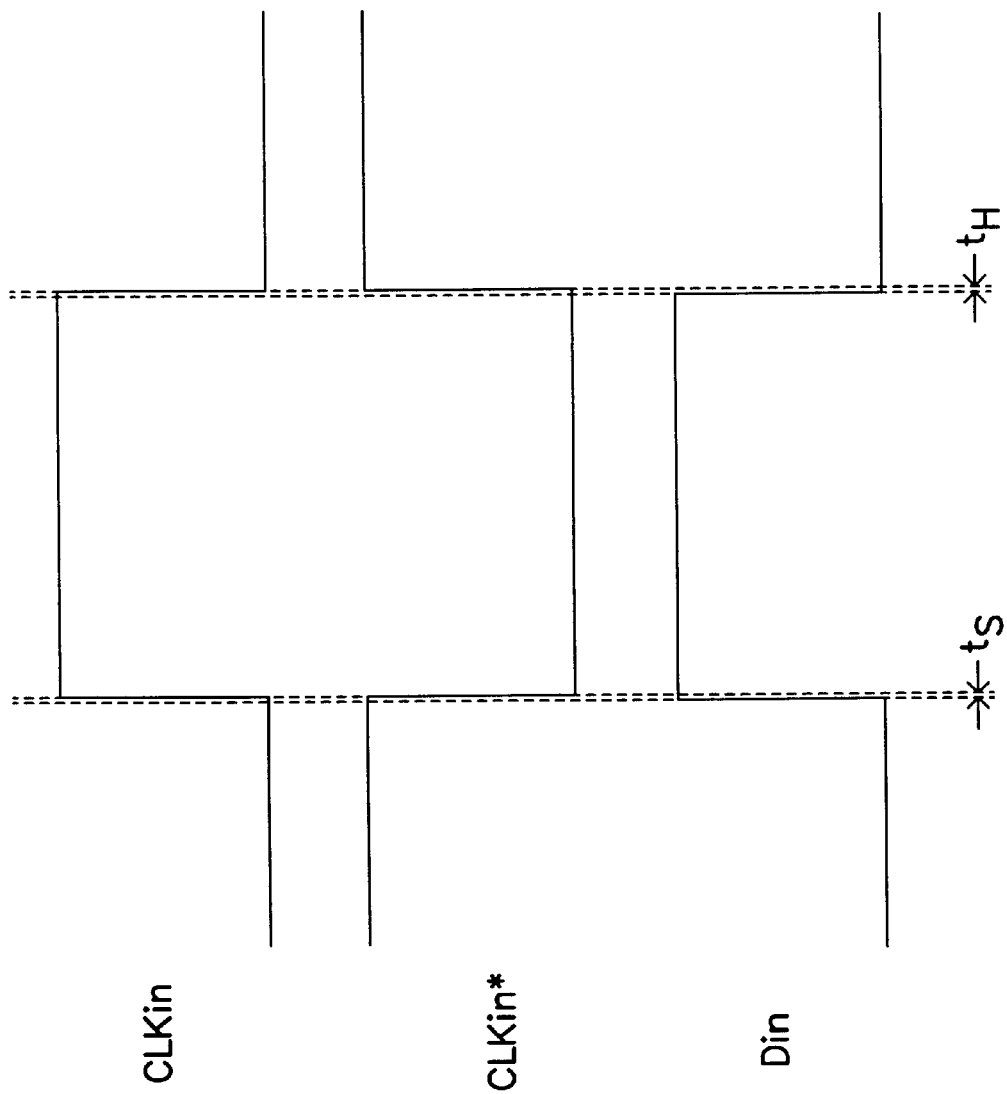
FIG. 3 is a timing diagram showing a setup and hold time of the latch according to the invention.

In operation, since clock path C1, clock path C2 and data path have matching elements, signals propagating on these paths will have a substantially or very nearly the same amount of propagation delay. In other words the signals on these paths arrive at latch node 260 of FIG. 2 at substantially the same time. Therefore, the setup and hold time of the latch, latch 299 of FIG. 2 is substantially equal to zero. The setup and hold time of latch 299 of FIG. 2 is shown in FIG. 3. As shown in FIG. 3, the setup time, indicated by $t_S$ is near zero, or substantially equal to zero. The hold time, indicated by $t_H$ is also near zero, or substantially equal to zero.

Referring to FIG. 2, inputs 201 and 202 of clock paths C1 and C2 receive differential clock signals CLKin and CLKin*, respectively. CLKin propagates along clock path C1 to enable node 255. CLKin* propagates along clock path C2 to enable node 265. The clock signals control the pass gates or switches 220 and 280 by turning them On or Off according the signal level of the clock signals. When CLKin is at a HIGH signal level, pass gate 220 is turned On and pass gate 280 is turned Off. When pass gate 220 is turned On, a data signal Din at input 200 propagates through pass gate 220 and three inverters, 210, 230 and 250 to latch node 260. The data is also propagates to output 270 through inverter 240. At this point, output signal Dout follows input signal Din. When CLK transitions to a LOW signal level, pass gate 220 is turned Off and pass gate 280 is turned On. When pass gate 280 is On, the data signal at latch node 260 prior to the CLK transition will be held at node 260. The data is also passed from latch node 260 through pass gate 280 to node 262 and consequently to output 270. The data remains in the same state until the next clock transition.

Figure 4:
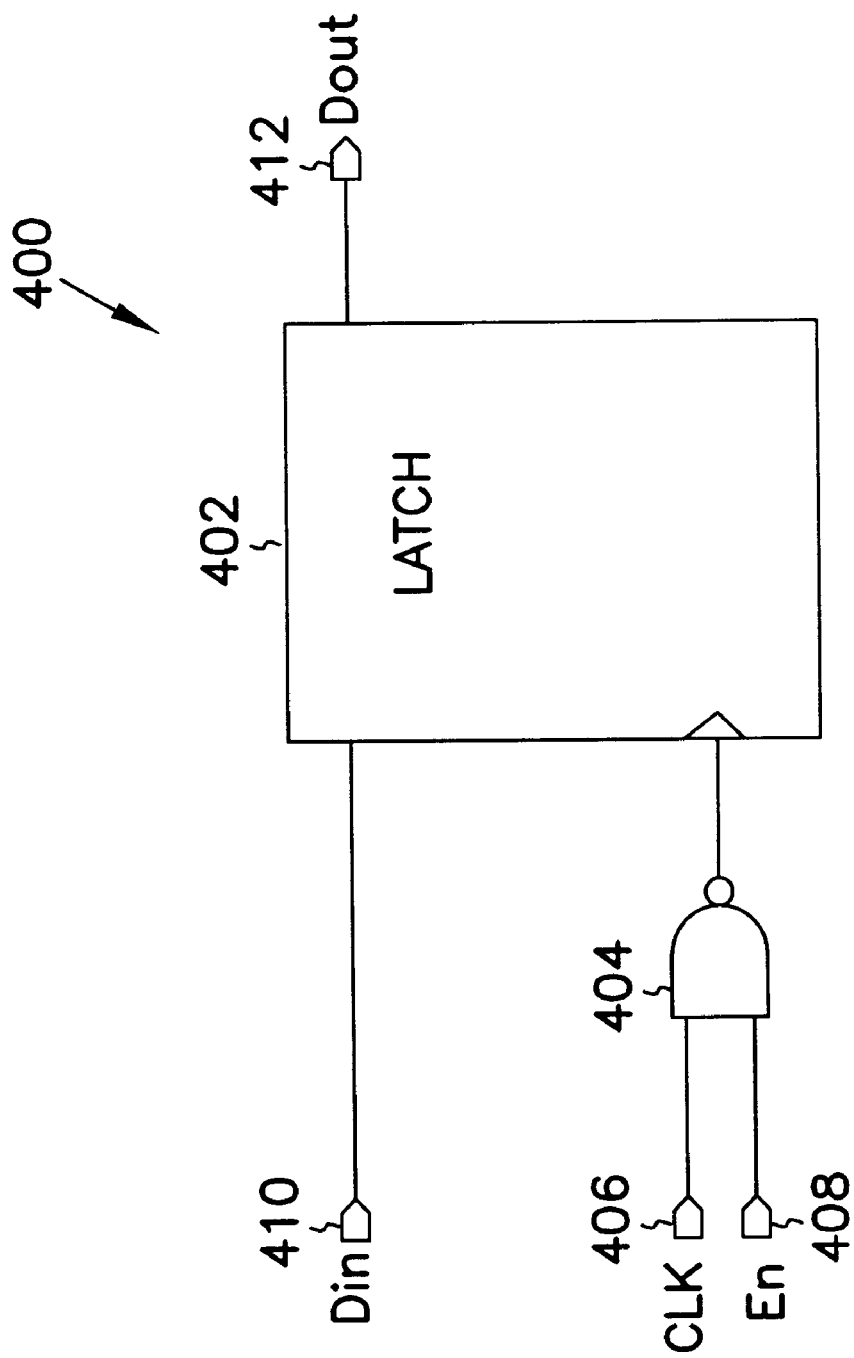
FIG. 4 is a prior art data capture latch.

FIG. 4 is a prior art data capture circuit 400. Circuit 400 includes a latch 402 and a NAND gate 404. NAND gate 404 is used to enable a clock signal CLK received at a clock input node 406 by an enable signal En at an enable node 408. When the CLK signal is enabled by the NAND gate 404, latch 402 latches a data signal Din at data input node 410. Latch 402 subsequently, at the next signal level of the clock signal, outputs output data Dout at an output node 412. One skilled in the art will readily recognize that NAND gate 404 and latch 402 as connected in FIG. 4 can be used to build a FIFO structure. However, using a NAND in this structure introduces a mismatch between data and the clock paths.

Figure 5:
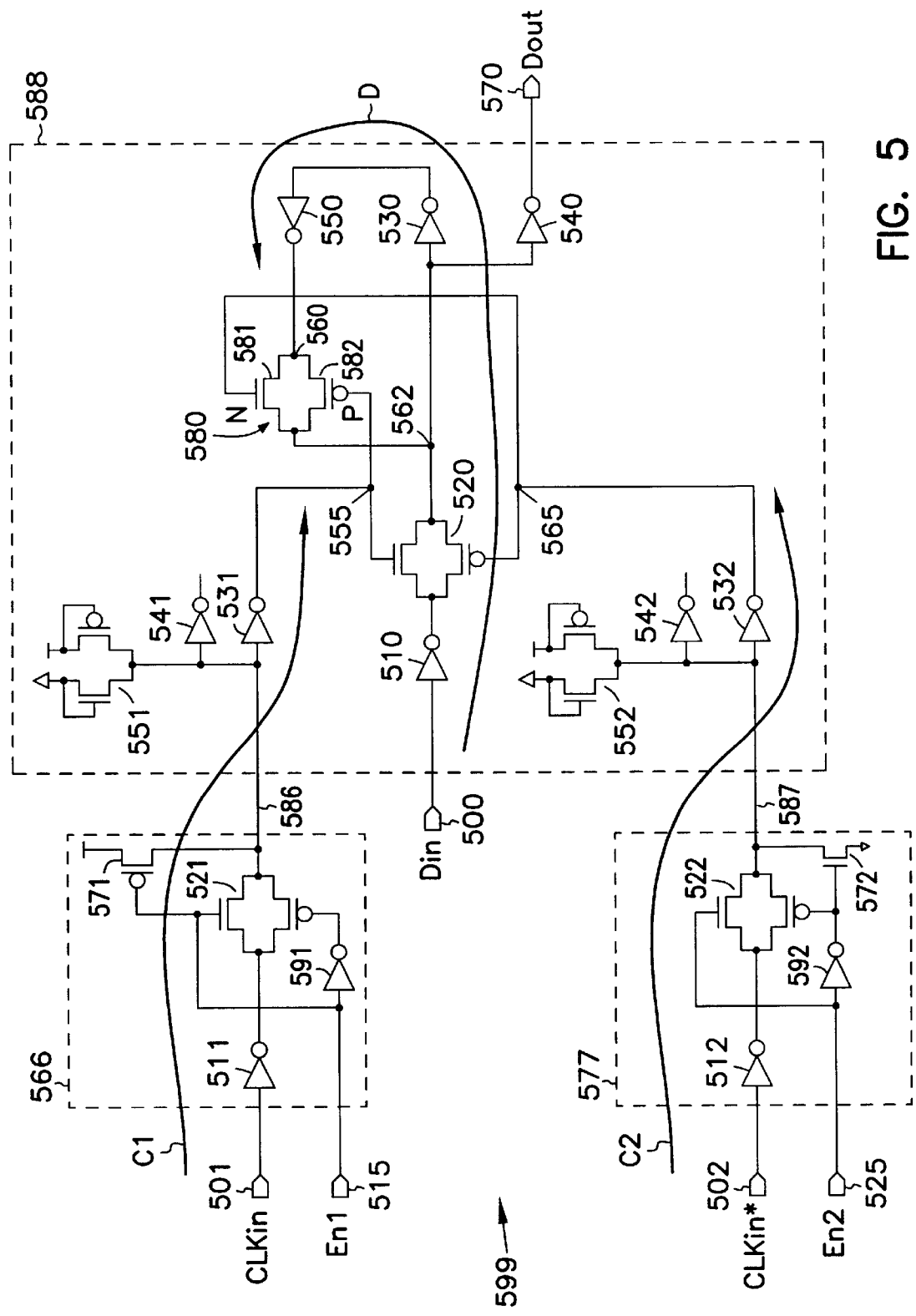
FIG. 5 is a data capture latch according to the invention.

FIG. 5 is a data capture circuit 599 according to the invention. Circuit 599 includes a latch 588 connected to a first clock enable circuit 566 at node 586 and a second clock enable circuit 577 connected at node 587. A part of first clock enable circuit 566 is included in a first clock path C1, and a part of second clock enable circuit 577 is included in a first clock path C2. Clock paths C1 and C2 enable latch 588 to latch an input data (Din) from a data path D.

First clock path C1 comprises a number of elements including an input 501, an inverter 511, a pass gate 521, inverters 531 and 541, and a pass gate 551. At the beginning of clock path C1, input 501 is connected to an input of inverter 511 whose output is connected to a first gate node of pass gate 521. A second node of pass gate 521 is connected to an input of inverter 531. An output of inverter 531 is connected to first enable node 555. Inverter 541 and pass gate 551 are connected to the second gate node of pass gate 521 as dummy elements or dummy loads. Dummy load 551 and 541 are connected such that they are always Off. The dummy loads are designed to match elements of clock path C2 and data path D to ensure that all paths have the same loading condition. Matching the elements including dummy loads between data path D and clock paths C1 and C2 also ensure that they have and same time delay or propagation delay.

First enable circuit 566 enables or disables clock path C1 by an enable signal En1 at an enable node 515. Enable node 515 is connected to one control input of pass gate 521. Another control input of pass gate 521 is connected to enable node 515 through an inverter 591. Enable node 515 is also connected to a gate of a pull up device 571 which has a drain connected to the second node of pass gate 521 and a source connected to a voltage supply.

Second clock path C2 comprises a number of elements including an input 502, an inverter 512, a pass gate 522, inverters 532 and 542, and a pass gate 552. At the beginning of clock path C2, input 502 is connected to an input of inverter 512 whose output is connected to a first gate node of pass gate 522. A second node of pass gate 522 is connected to an input of inverter 532. An output of inverter 532 is connected to second enable node 565. Inverter 542 and pass gate 552 are connected to the second gate node of pass gate 522 as dummy elements or dummy loads. Dummy load 552 and 542 are connected such that they are always Off. The dummy loads are designed to match elements of clock path C2 and data path D to ensure that all paths have the same loading condition. Matching the elements including dummy loads between data path D and clock paths C1 and C2 also ensure that they have and same time delay or propagation delay.

Second enable circuit 577 enables or disables clock path C2 by an enable signal En2 at an enable node 525. In one embodiment, second enable signal En2 of clock path C2 and first enable signal En1 or clock path C1 are the same signal. Enable node 525 is connected to one control input of pass gate 522. Another control input of pass gate 522 is connected to enable node 525 through an inverter 521. Enable node 525 is also connected to a gate of a pull down device 572 which has a source connected to the second node of pass gate 521 and a drain connected to a ground.

Data path D comprises a number of elements including an input 500, an inverter 510, pass gate 520, and inverters 530, 540 and 550. Input 500 is connected to an input of inverter 510 whose output is connected to a first gate node of pass gate 520. A second node of pass gate 520 is connected to an input of inverter 530. An output of inverter 530 is connected to an input of inverter 550. An output of inverter 550 is connected to a first latch node 560. Inverter 540 has its input connected to the second gate node of pass gate 520 at a second latch node 562. The output of inverter 540 is connected to an output node 570 to provide a data output signal (Dout).

Data capture circuit 500 of FIG. 5 has a first clock path C1 and a second clock path C2 with matching elements. The elements of data path D and the elements of first or second clock path C1 or C2 are also matched. In other words, all three paths, D, C1 and C2 have the same number and types of elements. For instance, inverter 510, pass gate 520, and inverters 530 and 540 of data path D match with inverter 511, pass gate 521, and inverters 531, 541. Similarly, the elements of data path D match with the elements of clock path C2. In addition, in a first instance, pass gate 580 can match with pass gates 551 and 552, and in a second instance pass gate 580 can match with inverter 550. As in the case of latch 299 of FIG. 3, those of ordinary skill in the art will readily recognize that a mismatch between a pass gate (pass gate 580) and an inverter (inverter 550) is not substantial. Furthermore, matching the elements of all the paths, D, C1 and C2 ensures that the signals, Din, CLKin and CLKin* are propagating through the same number and types of elements to latch node 560 of latch 599. Because the elements arc in the same chip and are constructed under the same fabrication parameters, they would have the same element property and delay time. Thus the matching of the elements reduces the setup and hold time of latch 599 to nearly zero.

In operation, when enable signals En1 and En2 are at a HIGH signal level. Pass gates 521 and 522 are turned on. Clock signal CLKin received at clock input 501 propagates from clock input 501 to node 555. When CLKin is at a HIGH signal level, pass gate 520 is turned On and pass gate 580 is turned Off. When pass gate 520 is turned On, data signal Din at input 500 propagates through pass gate 520 and three inverters, 510, 530 and 550 to latch node 560. The data is also propagates to output 570 through inverter 540. At this point, output signal Dout follows input signal Din. When CLK transitions to a LOW signal level, pass gate 520 is turned Off and pass gate 580 is turned On. When pass gate 580 is On, the data signal at latch node 560 prior to the transition of signal CLK will be held at node 560. The data is also passed from latch node 560 through pass gate 580 to node 562 and consequently to output 570. The data remains in the same state until the next clock transition.

Figure 6:
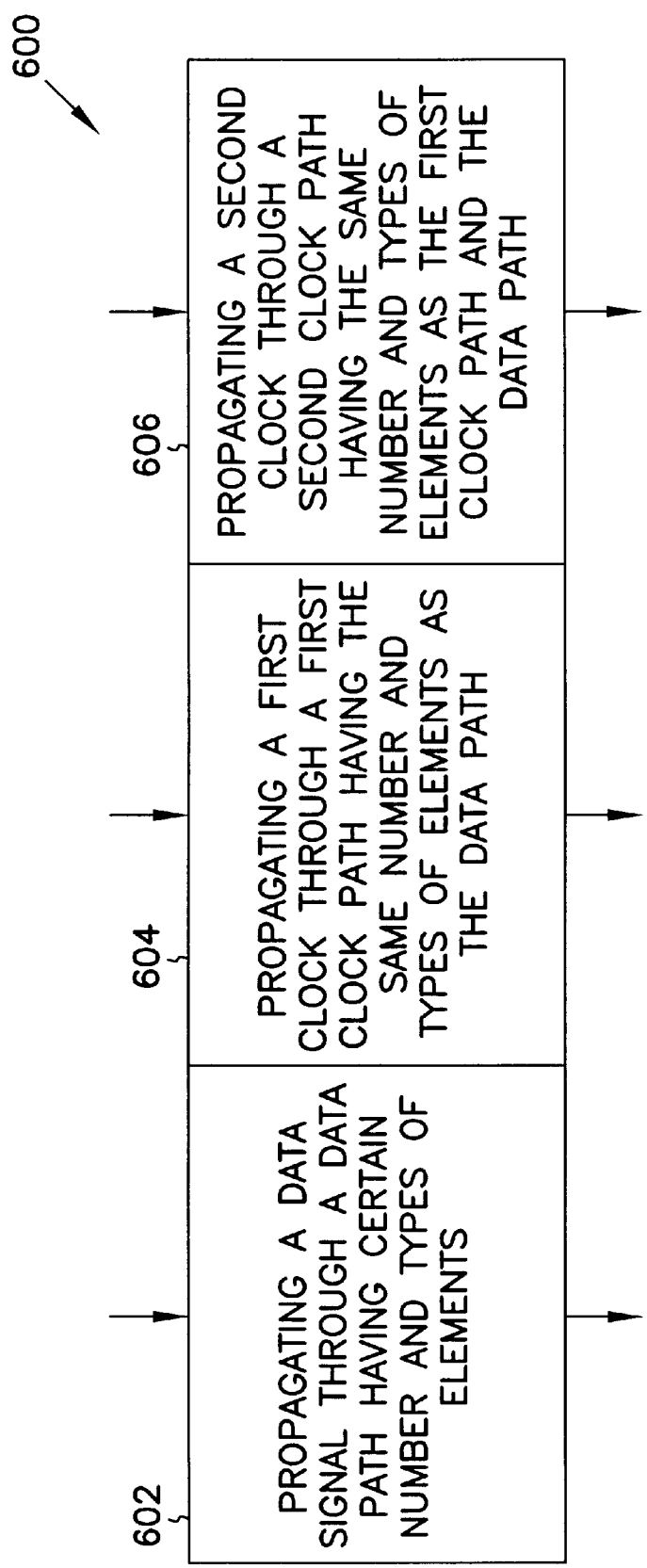
FIG. 6 is a flow chart of a method according to the invention.

FIG. 6 is a flow chart of a method 600 according to the invention. The method includes propagating a data signal through a data path having certain number and types of elements, indicated at box 602. The method also includes propagating a first clock signal through a first clock path having the same number and types of elements as the data path, indicated at box 604. The method further includes propagating a second clock signal through a second clock path having the same number and types of elements as the first clock path and the data path, indicated at box 606. In one embodiment, box 604 and 606 of method 600 can comprise a differential clock signal having two different phases. Each of the phases of the differential clock signal is used in a different clock path to enable the latch to latch the data.

FIG. 7 is a block diagram of a delay locked loop (DLL) 700 having a latch according to the invention. DLL 700 includes a delay line 702 connected to receive control signal from a controller 704. Delay line 702 can be a voltage controlled delay line, and controller 704 can be a low pass filter. Delay line 702 can also be a digital delay line having a plurality logic gates, and controller 704 can be a shift register or a counter. Delay line 702 has an input at node 706 to receive an input clock signal CLKin and an output at node 708 to provide an output clock signal CLKout. DLL 700 also includes a phase detector 710 connected to receive and detect a phase difference between clock signals CLKin and CLKout. Phase detector 710 enables controller 704 to adjust delay line 702 until the DLL is locked. Phase detector 710 can be latch 599 of the invention shown in FIG. 5. Using latch 599 as phase detector 710 reduces jitter in timing loop of DLL 700. Furthermore, latch 599 can be use in other integrated circuits similar to DLL 700 where accurate timing capture and reduced jittering in timing loop are required.

FIG. 8 is block diagram of a system 800 incorporating the invention. System 800 includes a first integrated circuit 802 connected to a second integrated 804. Integrated circuit 804 includes a data capture latch 806. Latch 806 receives data (DATA) and first clock (CLOCK) signals from integrated circuit 802 at nodes 808 and 810 respectively, and receives a second clock signal (CLK) at node 812. Latch 806 can be latch 599 of the invention shown in FIG. 5, which provides accurate data capturing because of its characteristics as described in the description of latch 599. Both integrated circuits 802 and 804 can be any type of integrated circuit, including, but not limited to a processor, memory, memory controller or application-specific integrated circuit (ASIC).

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is intended that this invention be limited only by the claims and the equivalents thereof.

What is claimed is:

1. A latch comprising:
    a pass gate;
    a multiple clock paths connected to the pass gate; and
    a data path connected to the pass gate, wherein the data path and each of the multiple clock paths have the same number of matching elements.

2. The latch according to claim 1, wherein the matching elements include dummy loads.

3. The latch according to claim 1, wherein each of the multiple clock paths and the data path have the same loading condition.

4. The latch according to claim 1, wherein the latch has a setup time and a hold time, wherein the setup time and the hold time is substantially equal to zero.

5. The latch according to claim 1, wherein the pass gate comprises n-channel and p-channel devices.

6. A latch comprising:
    a pass gate;
    a multiple clock paths connected to the pass gate; and
    a data path connected to the pass gate, wherein the data path and the multiple clock paths have matching elements, wherein each of the multiple clock paths and the data path have the same type and number of elements.

7. A latch comprising:
    a pass gate having a first and a second control input, and a latch node
    a first clock path connected to the first control input,
    a second clock path connected to the second control input; and
    a data path connected to the latch node, wherein the data path, the first clock path and the second clock path have the same number and type of elements.

8. The latch according to claim 7, wherein the first and second clock paths propagate differential clock signals to the first and second control inputs, and the data path propagates a data signal to the latch node such that the data signal arrives at the latch node at the same time with the differential clock signals.

9. The latch according to claim 7, wherein the latch has a setup time and a hold time, wherein the setup time and the hold time is substantially equal to zero.

10. The latch according to claim 7, wherein the first and the second clock path and the data path have the same time delay.

11. The latch according to claim 7, wherein the pass gate comprises n-channel and p-channel devices.

12. The latch according to claim 7, wherein the first and second clock paths include dummy loads.

13. A data capture circuit comprising:
    a latch having a data path, a first clock and a second clock path;
    a first enable circuit to control the first clock path; and
    a second enable circuit to control the second clock path, wherein the data path, the first clock path and the second clock path have the same number of matching elements.

14. The latch according to claim 13, wherein the first clock and second clock signals are complementary.

15. A data capture circuit comprising:
    a latch having a data path, a first clock and a second clock path;
    a first enable circuit to control the first clock path; and
    a second enable circuit to control the second clock path, wherein the data path, the first clock path and the second clock path have matching elements, wherein the second enable circuit comprises:
    a pull down device;
    a second clock input node to receive a second clock signal; and
    a second enable node to receive a second enable signal, the second enable signal activating the enable circuit to propagate the second clock signal to the latch.

16. A data capture circuit comprising:
    a latch having a data path, a first clock and a second clock path;
    a first enable circuit to control the first clock path; and
    a second enable circuit to control the second clock path, wherein the data path, the first clock path and the second clock path have matching elements, wherein the first enable circuit comprises:
    a pull up device;
    a first clock input node to receive a first clock signal; and
    a first enable node to receive a first enable signal, the first enable signal activating the enable circuit to propagate the first clock signal to the latch.

17. An integrated circuit comprising:
    a delay line connected to receive an input clock signal to produce an output clock signal;
    a controller connected to the delay line;
    a phase detector connected to the controller, the phase detector comprising:
    a latch;
    a first and a second clock path connected to the latch
    a first enable circuit to control the first clock path; and
    a second enable circuit to control the second clock path, wherein the first clock path and the second clock path have matching elements.

18. The integrated circuit according to claim 17, wherein the first enable circuit comprises:

a pull up device;

a first clock input node to receive the input clock signal; and a first enable node to receive a first enable signal, the first enable signal activating the enable circuit to propagate the input clock signal to the latch.

19. The integrated circuit according to claim 17, wherein the second enable circuit comprises:

a pull down device;

a second clock input node to receive the output clock signal; and a second enable node to receive a second enable signal, the second enable signal activating the enable circuit to propagate the output clock signal to the latch.

20. A system comprising:

a first integrated circuit;

a second integrated circuit connected to the first integrated circuit, the second integrated circuit including a data capture latch to capture a data from the first integrated circuit, wherein the data capture latch including:

a latch having a data path, a first clock and a second clock path;

a first enable circuit to control the first clock path; and a second enable circuit to control the second clock path, wherein the data path, the first clock path and the second clock path have the same number of matching elements.

21. A system comprising:

a first integrated circuit;

a second integrated circuit connected to the first integrated circuit, the second integrated circuit including a data capture latch to capture a data from the first integrated circuit, wherein the data capture latch including:

a latch having a data path, a first clock and a second clock path;

a first enable circuit to control the first clock path; and a second enable circuit to control the second clock path, wherein the data path, the first clock path and the second clock path have matching elements, wherein the first enable circuit comprises:

a pull up device;

a first clock input node to receive a first clock signal; and a first enable node to receive a first enable signal, the first enable signal activating the enable circuit to propagate the first clock signal to the latch.

22. A system comprising:

a first integrated circuit;

a second integrated circuit connected to the first integrated circuit, the second integrated circuit including a data capture latch to capture a data from the first integrated circuit, wherein the data capture latch including:

a latch having a data path, a first clock and a second clock path;

a first enable circuit to control the first clock path; and a second enable circuit to control the second clock path, wherein the data path, the first clock path and the second clock path have matching elements, wherein the second enable circuit comprises:

a pull down device;

a second clock input node to receive a second clock signal; and a second enable node to receive a second enable signal, the second enable signal activating the enable circuit to propagate the second clock signal to the latch.

23. A method of reducing a setup and hold time of a latch, the method comprising:

propagating a data signal through a data path having certain number and types of elements;

propagating a first clock signal through a first clock path having the same number and types of elements as the data path; and propagating a second clock signal through a second clock path having the same number and types of elements as the first clock path and the data path.

24. The method according to claim 23, wherein propagating a data signal includes passing the data signal from an input node to an output node when the clock signal is at one signal level and holding the signal at a latch node and the output node in the same state when the clock signal is at another signal level.

25. The method according to claim 23, wherein propagating the clock signal to the pass gate includes turning on the pass gate when the clock signal is at one clock signal level and turning off the pass gate when the clock signal is at another clock level signal.

* * * * *